United States Patent
Takahashi et al.

(10) Patent No.: US 6,262,561 B1
(45) Date of Patent: Jul. 17, 2001

(54) BATTERY SYSTEM AND ELECTRIC VEHICLE USING THE BATTERY SYSTEM

(75) Inventors: Tadashi Takahashi; Yoshiaki Kumashiro; Akihiko Emori; Hideki Miyazaki, all of Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/219,433

(22) Filed: Dec. 23, 1998

(30) Foreign Application Priority Data

Dec. 26, 1997 (JP) .................................................. 9-359184

(51) Int. Cl.[7] .................................................... H02J 7/00
(52) U.S. Cl. ............................................. 320/104; 320/122
(58) Field of Search ..................................... 320/104, 118, 320/122

(56) References Cited

U.S. PATENT DOCUMENTS

| | | | |
|---|---|---|---|
| 5,153,496 | | 10/1992 | LaForge ................................ 320/119 |
| 5,387,857 | * | 2/1995 | Honda et al. ......................... 320/120 |
| 5,504,415 | * | 4/1996 | Podrazhansky et al. ............ 320/122 |
| 5,547,775 | * | 8/1996 | Eguchi et al. ........................ 320/118 |
| 5,557,189 | * | 9/1996 | Suzuki et al. ........................ 320/119 |
| 5,578,914 | * | 11/1996 | Morita .................................. 320/122 |
| 5,581,170 | * | 12/1996 | Mammano et al. .................. 320/116 |
| 5,670,861 | * | 9/1997 | Nor ....................................... 320/118 |
| 5,675,233 | * | 10/1997 | Kaneko et al. ....................... 320/122 |
| 5,677,613 | * | 10/1997 | Perelle ................................. 320/122 |
| 5,773,957 | * | 6/1998 | Imaseki ................................ 320/122 |
| 5,818,201 | * | 10/1998 | Stockstad et al. .................... 320/119 |
| 5,886,503 | * | 3/1999 | McAndrews et al. ............... 320/121 |
| 5,897,973 | * | 4/1999 | Stephenson et al. ................ 320/162 |
| 5,932,990 | * | 8/1999 | Kaneko ................................ 320/122 |
| 5,945,804 | * | 8/1999 | Hansson et al. ..................... 320/122 |
| 5,998,969 | * | 12/1999 | Tsuji et al. ........................... 320/132 |

FOREIGN PATENT DOCUMENTS

| | | |
|---|---|---|
| 195 45 833 | 12/1995 | (DE) . |
| 814556A2 | 12/1997 | (EP) . |
| 7-230829 | 8/1995 | (JP) . |
| 0918237A | 7/1997 | (JP) . |
| 09200968A | 7/1997 | (JP) . |
| 9515604 | 6/1995 | (WO) . |

OTHER PUBLICATIONS

T. Miyamoto et al., "Advanced Battery System for Electric Vehicle (FEV–II)", EVS–13: The 13th Int'l Electric Vehicle Symposium, Oct. 13–16, 1996, Osaka, Japan.

* cited by examiner

Primary Examiner—Peter S. Wong
Assistant Examiner—Pia Tibbits
(74) Attorney, Agent, or Firm—Antonelli, Terry, Stout & Kraus, LLP (57) ABSTRACT

A battery system includes a battery assembly having a plurality of modules, which are controlled by a system control circuit, each module including a module control circuit and a module by-pass circuit which is controlled via the module control circuit so as to suppress the charging variation among the plurality of modules. Each control circuit and the system-controlling circuit are connected to each other via a bilateral transmission medium and each module by-pass circuit is controlled based on information bilaterally transmitted between each module control circuit and the system control circuit via the bilateral transmission medium.

5 Claims, 7 Drawing Sheets

BATTERY SYSTEM AND ELECTRIC VEHICLE USING THE BATTERY SYSTEM

BACKGROUND OF THE INVENTION

The present invention relates to a battery system, and especially to a battery system composed of a plurality of lithium battery modules connected to each other, for use in an electric vehicle.

The lithium battery has recently received considerable attention as a light-weight, high power-density battery with a large capacity, and which is suitable for use in an electric vehicle. However, since lithium batteries have a low tolerance level against over-charging and over-discharging, the misuse of a lithium battery may cause a fire or an explosion. Therefore, it is necessary to closely monitor and control the terminal voltage of a lithium battery.

A conventional battery system composed of a plurality of modules serially connected to each other, each module including cell batteries serially connected to each other, is disclosed, for example, in a paper "Advanced Battery System for Electric Vehicle," EVS-13, Osaka, Japan. Each module is controlled in this battery system by a cell controller. A by-pass circuit is provided in each cell, and the cell controller controls each module so that any charging variation among the cells in each module is suppressed. The total battery system is controlled by a battery controller, and each cell controller sends signals to the battery controller.

As mentioned above, although the conventional battery system controls the charging-balance among the cells in each module, the system does not take the charging variation among the modules into consideration. However, in a battery system composed of many modules serially connected to each other, if there is a charging variation among the modules, the terminal voltage of only some of the modules attains the rated terminal voltage, and the terminal voltage of the rest of the modules remains under the rated terminal voltage, Accordingly, the full capacity of the battery system cannot be achieved. Furthermore, if there exists a charging variation among the modules, this also causes a variation in the length of their life cycles.

SUMMARY OF THE INVENTION

An object of the present invention is to suppress the charging variation among modules in a battery system.

The above object is attained by providing a by-pass circuit in each module and by controlling the by-pass circuit via a module-controlling circuit. Furthermore, the charging variation among the modules is reduced by controlling each by-pass circuit based on information bilaterally transmitted between each module-controlling circuit and a system-controlling circuit.

DETAILED DESCRIPTION OF THE EMBODIMENTS

Figure 6:
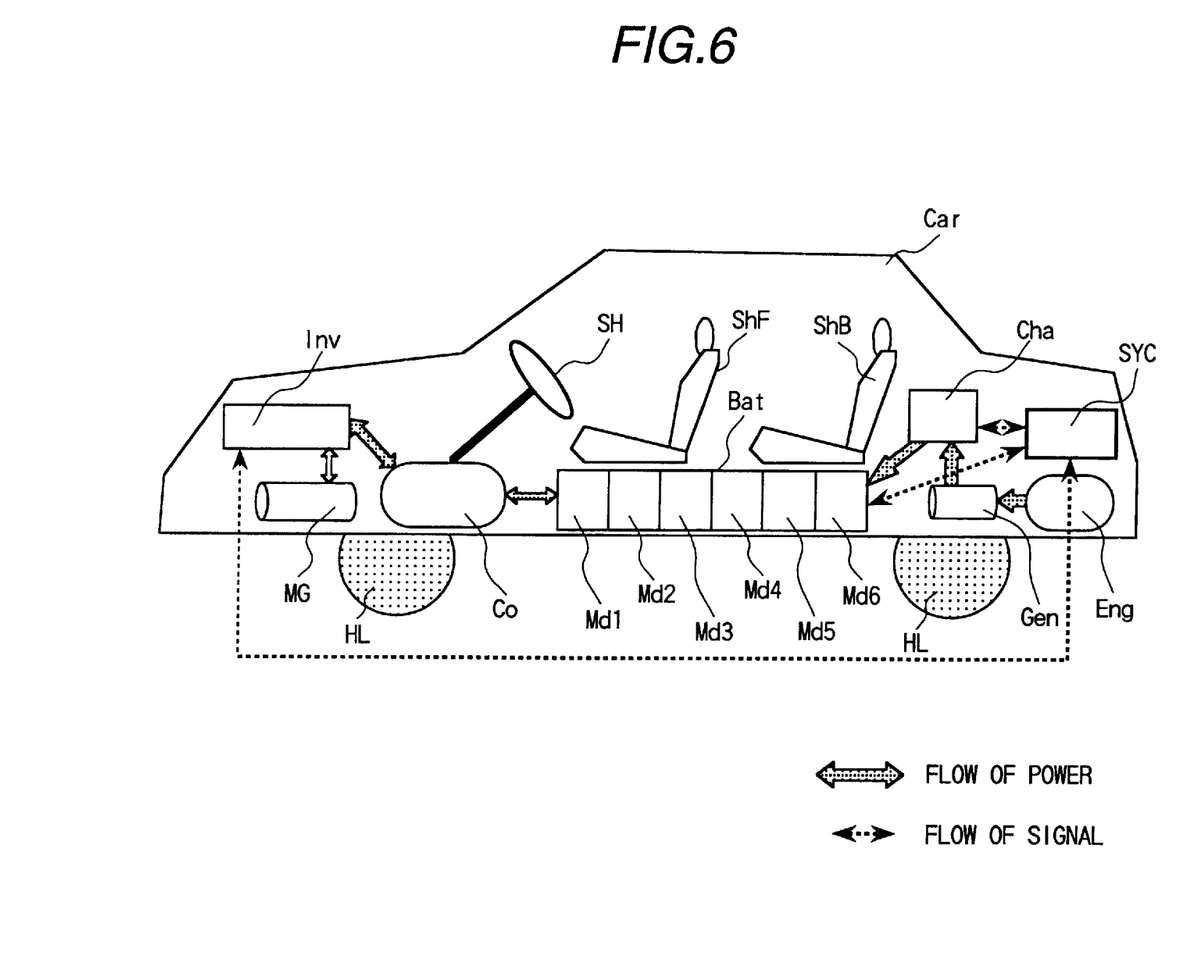
FIG. 6 is a diagram of a hybrid electric vehicle embodying still another embodiment according to the present invention.

To begin with, examples of an electric vehicle and a battery system for use in a hybrid electric vehicle (HEV) will be explained below with reference to FIG. 6 and FIG. 7. FIG. 6 shows a hybrid electric vehicle in which reference symbols Car and SH indicate the body of the electric car and the steering wheel, respectively. Moreover, reference symbols ShF and ShB indicate front and back seats. Reference symbol Bat indicates a battery assembly composed of modules Md1–Mdn (only six modules Md1–Md6 are shown in FIG. 6.) Also, each module is composed of a plurality of battery cells) (hereafter referred to as cells. Reference symbol Eng indicates an engine, and the energy generated in this engine drives the wheels and generates power by driving a generator Gen at the same time. Furthermore, the battery assembly Bat is charged by the generated power via a charger Cha. Also, a capacitor Co is connected to the battery assembly Bat in parallel, and the energy accumulated in the battery assembly Bat also is used to drive the wheels HL by driving a motor generator MG via an inverter Inv. Furthermore, the motor generator MG is driven by the wheels HL during a braking operation, and the power generated by the motor generator MG is used to charge the battery assembly Bat by a regenerative operation of the inverter Inv. Also, the engine Eng generates power by driving a generator Gen, and this power is used to charge the battery assembly Bat via the charger Cha. The above-mentioned operations in the electric vehicle are controlled by a system-controlling circuit SYC which, while accepion input signals from the battery assembly Bat, the inverter Inv, and the charger Cha, transmits information along signal path shown by dotted lines with arrows. In FIG. 6, fat lines with arrows indicate paths of energy flow, and the dotted lines with arrows indicate signal flow paths.

Meanwhile, in other examples of the HEV system, an engine Eng is sometimes connected to motor generator MG, and generator Gen and the charger Cha are omitted.

Figure 7:
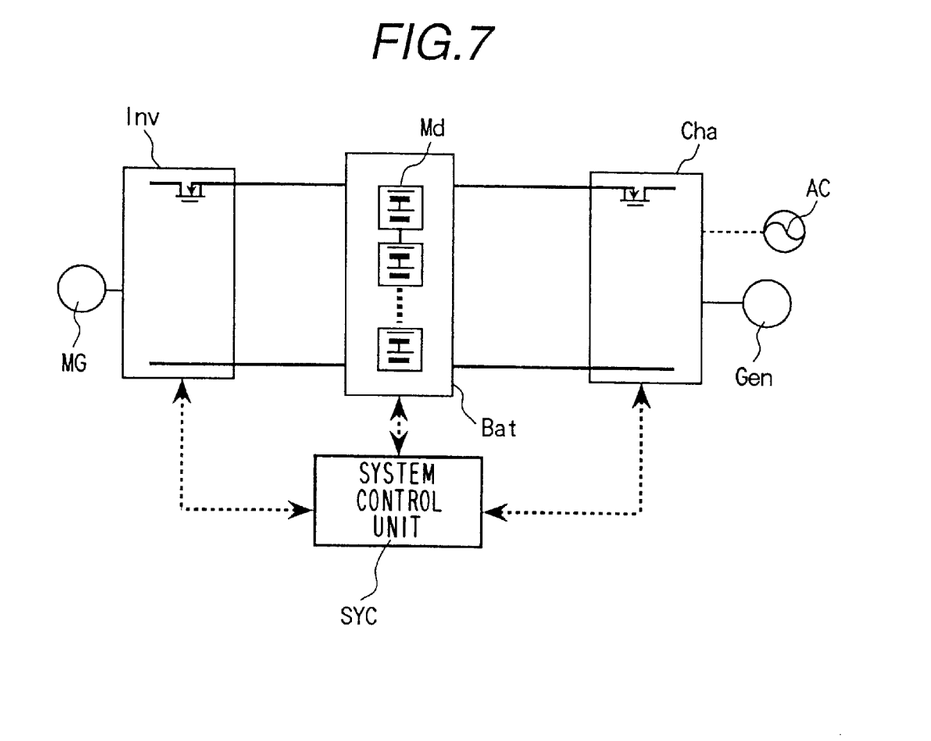
FIG. 7 is a simplified schematic diagram showing an example of the components of a battery system according to the present invention.

FIG. 7 is a simplified diagram showing an example of the components of a battery system. The battery assembly Bat is composed of a plurality of battery modules (hereafter, a battery module is referred to as a module Md) serially connected to each other. Moreover, each module is also composed of a plurality of cells serially connected to each other. There are two methods of charging the battery assembly Bat: a method in which the battery assembly Bat is charged with power generated by the generator Gen installed in the HEV via the charger Cha, and a method in which the battery assembly Bat is charged with power generated by the motor generator MG using the energy generated in a braking operation. Moreover, it is also possible to charge the battery assembly Bat by using an AC power source via the charger Cha at a charging station. In the discharging operation of the battery assembly Bat, the motor generator MG is driven by the discharged energy via the inverter Inv, and the motor generator MG drives the wheels HL. The above-mentioned operations are controlled by a system-controlling circuit SYC which accepts input signals from the battery assembly Bat, the inverter Inv, and the charger Cha.

Figure 8:
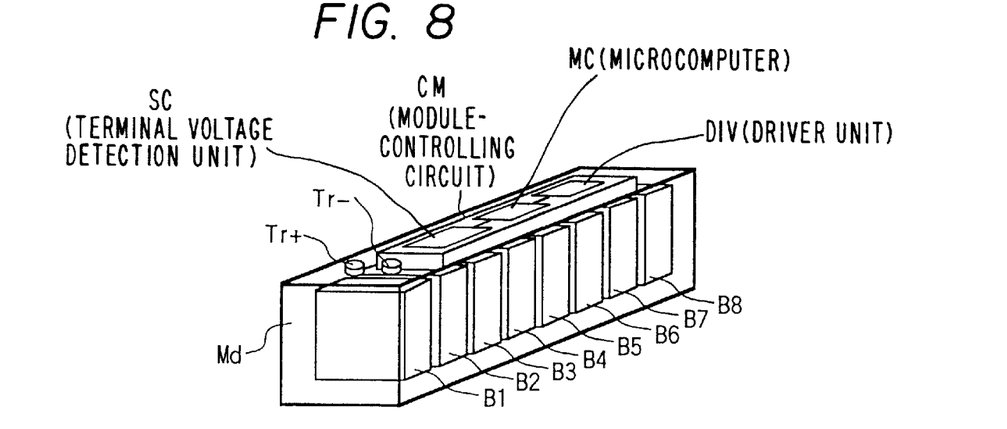
FIG. 8 is a perspective view showing an example of the composition of a battery module used in the battery system according to the present invention.

FIG. 8 is a diagram showing an example of the battery module used in the battery system. Each module is composed of eight cells B1–B8 serially connected to each other. Reference symbols Tr+ and Tr− indicate the positive and negative electrode terminals 1 respectively. Reference symbol CM indicates a module-controlling circuit, and includes a terminal voltage-detection unit SC, a microcomputer MC, a driver unit DIV, and semiconductor elements.

Figure 1:
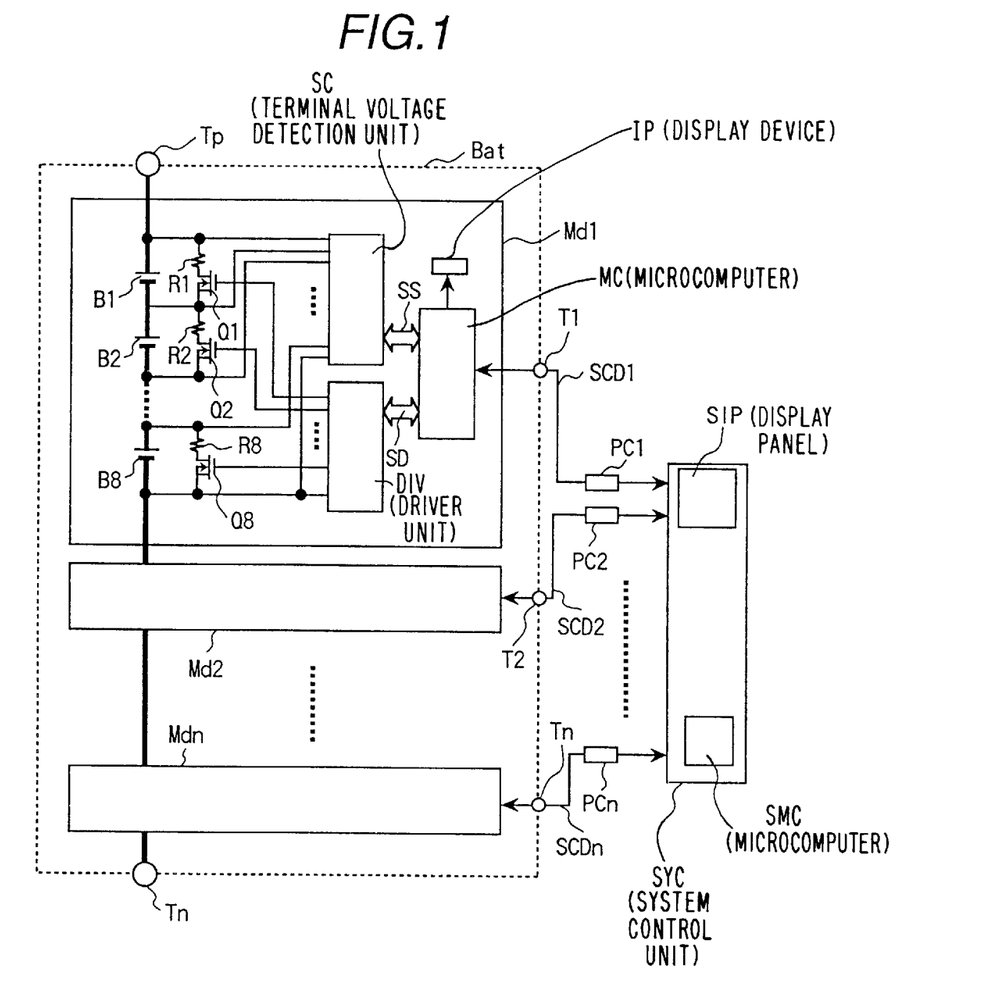
FIG. 1 shows is a schematic diagram of a battery system representing an embodiment according to the present invention.

FIG. 1 shows a battery system representing an embodiment according to the present invention. Moreover, this figure shows the relationship between the system control unit SYC and the battery assembly Bat composed of modules Md1–Mdn. In this embodiment, the module Md1 includes eight cells B1–B8. Here, the terminals of a circuit composed of a resistor R and a semiconductor element Q serially connected to each other are connected to the positive and negative terminals of the cell B1 in parallel, and a similar circuit is also connected to each of the rest of the cells B2–B8, in parallel. The semiconductor elements Q1–Q8 are driven by the driver DIV in response to an instruction sent from the microcomputer MC. Moreover, the positive and negative electrode terminals of each of the cells B1–B8 are connected to the terminal voltage-detection unit SC, and the terminal voltage of each cell is measured by the terminal voltage-detection unit SC. The value of a measured terminal voltage is sent to the microcomputer MC via a drive bus SS. Also, the microcomputer MC and the driver DIV are connected to each other via a drive bus SD. A display device IP is connected to the microcomputer MC, and displays necessary information—such as information regarding an abnormal condition state—according to an instruction sent from the microcomputer MC. As shown in FIG. 1, the modules Md1–Mdn are serially connected, and the positive electrode terminal of the module Md1 and the negative electrode terminal of the module Mdn are connected to the positive and negative electrode terminals Tp and Tn of the battery assembly Bat, respectively. Moreover, the module Md1 is connected to the system control unit SYC via an isolation device PC1. The, the module Md1 is connected to the isolation device PC1 from a terminal T1 via a bus SCD1. In the same manner, each of the modules Md2–Mdn is connected to the system control unit SYC via respective isolation devices PC2–PCn. The system control unit SYC is controlled by the microcomputer SMC, and displays necessary information—such as that regarding abnormal conditions on a display panel SIP according to an instruction sent from the microcomputer MC.

The reason why a plurality of cells are integrated into a module and a plurality of modules are integrated into a battery assembly is that, since the tolerance level against over-charging or over-discharging is low in a lithium battery, and a misuse may lead to a fire or an explosion, the safety is improved by dividing cells into blocks or modules. In addition, since the terminal voltage of a lithium battery cell is as high as 3–4V, if eight cells are serially connected into a module, the terminal voltage of the module will be in a safe terminal voltage range of 24–32V, and the module can be easily operated. Furthermore, since the terminal voltage of each module is 24–32V or less, and circuit elements for such a terminal voltage range are easily obtained, the system control unit SYC can be cheaply fabricated. Furthermore, since the total terminal voltage of the battery assembly Bat is more than 300V, it is necessary to isolate each module from the system control unit SYC by using a respective isolation device PC.

Now, the operation of the module Md1 shown in FIG. 1 will be explained. The terminal voltage of each of the cells B1–B8 is read into the microcomputer MC in the module. The microcomputer MC monitors the terminal voltage of each of cells B1–B8. In order to suppress a variation in the changing, if it is detected that one of the cells has a particularly high terminal voltage, the charging current flowing toward the cell is shunted to its cell by-pass circuit by turning on its cell by-pass circuit composed of the resistor R and the semiconductor element Q. Accordingly, since the charging current flowing into the cell becomes smaller than that in the other cells, the terminal voltage of the cell gradually decreases almost to the terminal voltage level of the other cells. Furthermore, if the terminal voltage of the cell becomes equal to the terminal voltage level of the other cells, the by-pass circuit is turned off. Thus, the charging variation among the cells in each module is suppressed in each module.

Next, if the charging variation among the modules Md becomes large, the system control unit SYC determines which module has a higher terminal voltage and sends a control signal to each module based on information transmitted between the microcomputer MC in each module and the microcomputer SMC in the system control unit SYC. For example, if the terminal voltage value of the module Md1 is higher by a predetermined value than the terminal voltage values of the other modules, the microcomputer SMC in the system control unit SYC sends a control signal to turn on all the cell by-pass circuits in the module Md1. Thus, since the charging current flowing in the module Md1 decreases to a level lower than that of the other modules, the terminal voltage value of the module Md1 gradually decreases to a level almost equal to the terminal voltage values of the other modules.

Figure 2:
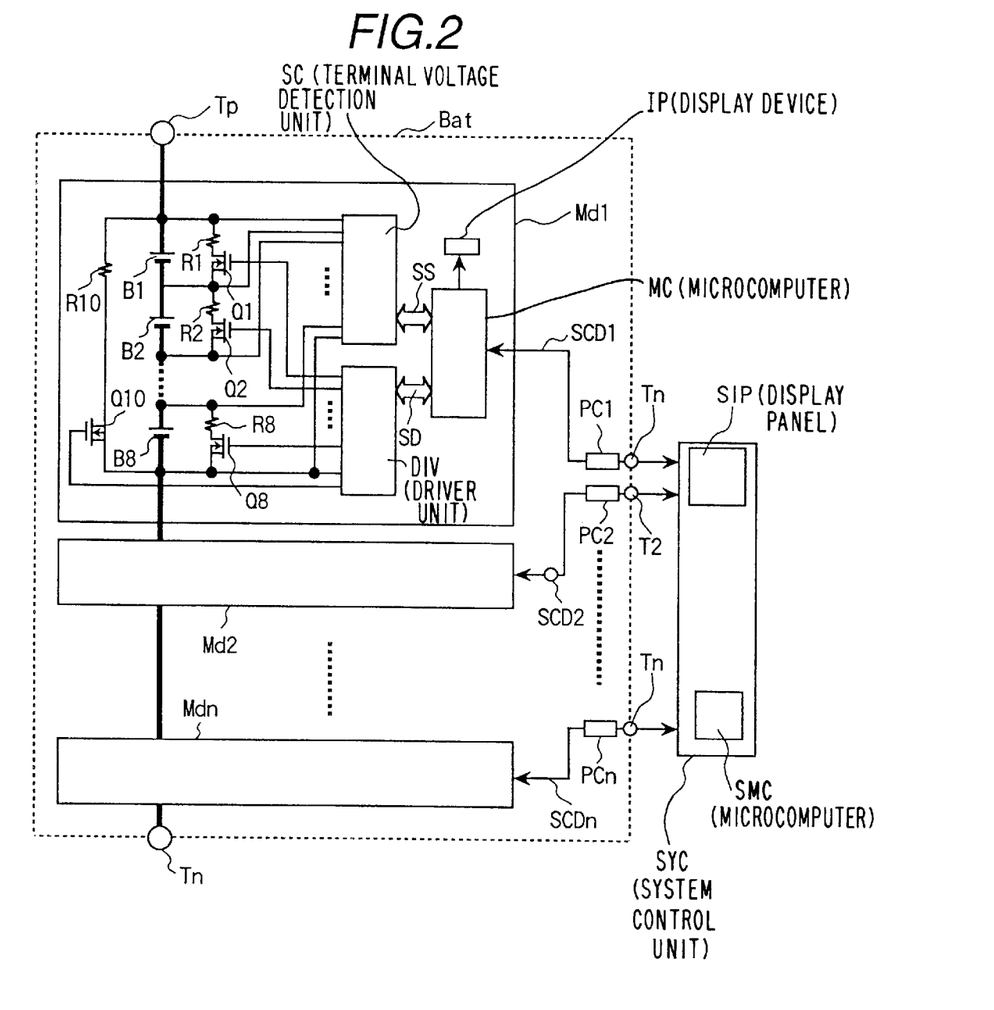
FIG. 2 is a schematic diagram of a battery system representing another embodiment according to the present invention.

FIG. 2 shows a battery system representing another embodiment according to the present invention.

A component with the same reference symbol as that shown in FIG. 1 performs the same operation as that of the component of FIG. 1. The circuitry shown in FIG. 2 is different from the circuitry shown in FIG. 1 in that a module by-pass circuit is provided for each module, and the isolation devices PC are installed inside the battery assembly Bat. Using the module Md1 as an example, the module by-pass circuit will be explained. Each module by-pass circuit is composed of a pair of a resistor Ri0 and a semiconductor element Qi0 serially connected to each other, and the module by-pass circuit is connected to both terminals of the respective module composed of cells B1–B8 in parallel, which cells are serially connected to each other. Moreover, the module by-pass circuit is driven by a control signal sent from the microcomputer SMC (MC) via the drive circuit DIV. According to the above arrangement, it is possible to cope with both the charging variation among cells in each module and the charging variation among modules. Also, although the isolation devices PC are installed outside the battery assembly Bat in the embodiment shown in FIG. 1, the isolation devices PC are installed inside the battery assembly Bat in this embodiment shown in FIG. 2. By using the composition shown in FIG. 2, because it is adaptable to various types of arrangement for the system control unit SYC, the battery assembly Bat can be used with greater flexibility.

Figure 3:
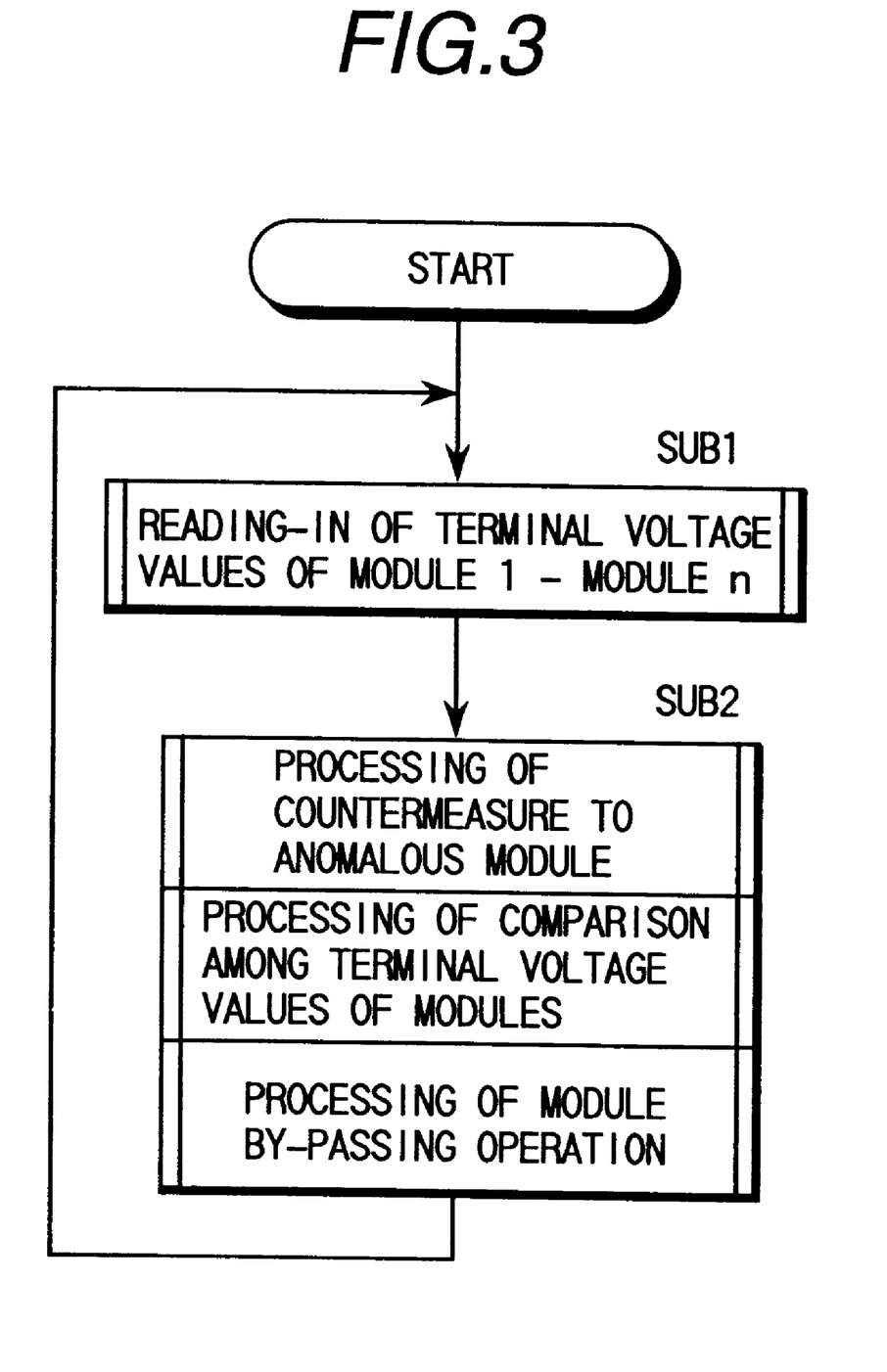
FIG. 3 is a main flow chart of a software program executed in the embodiments according to the present invention.

FIG. 3 is the main flow chart of a software program executed according to the present invention. This flow chart shows the process of controlling the battery assembly Bat, which is executed by the system control unit SYC shown in FIG. 1 and FIG. 2. When the process is started, the terminal voltage of each of the modules Md1–Mdn is read in by the subroutine SUB1. Next, the possible occurrence of an abnormality in the terminal voltage of each of the modules Md1–Md2 is checked for, and if an abnormality which causes the variation of the voltage among the modules to be larger than a predetermined reference value is detected, the processing of a countermeasure to the abnormality is carried out, for example, bypassing an abnormal module, and this processing is finished. Conversely, if no abnormality is detected, the terminal voltage values of the modules Md1–Mdn are compared with a reference value Vu, and the module by-pass device is turned on or off based on the result of the comparison. The above process will be explained in more detail with reference to FIG. 4 and FIG. 5.

Figure 4:
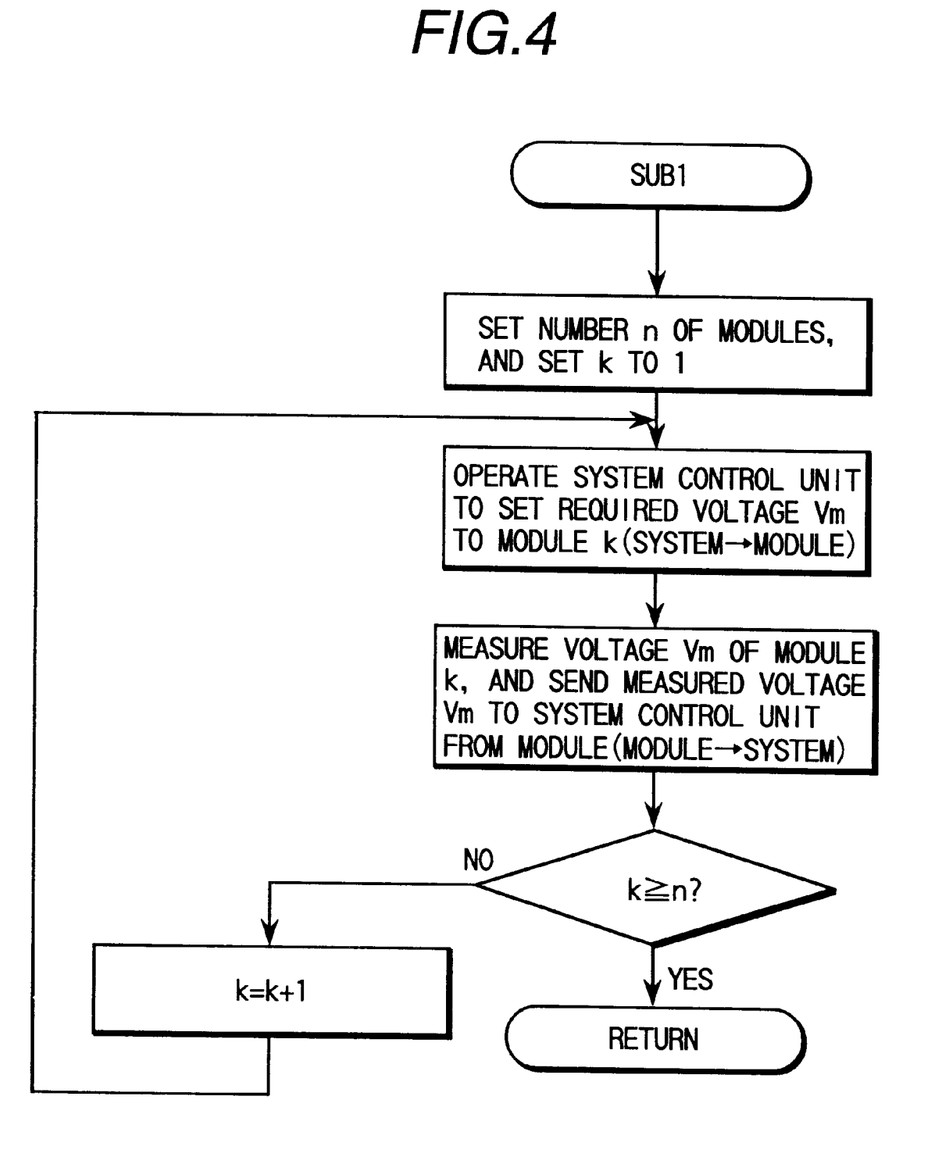
FIG. 4 is a flow chart of a subroutine SUB1 executed in the program shown in FIG. 3.

FIG. 4 is a flow chart of the subroutine SUB1. The subroutine SUB1 executes the process of reading in the terminal voltage values. Firstly, the number n of the modules is set, and the number 1 is further set to the module number k. Moreover, the system control unit SYC requires the module MD1 to send a terminal voltage value Vm1. After setting the required terminal voltage value Vm1, the microcomputer MC in the module Md1 shown in FIG. 1 sends the present terminal voltage Vm1 obtained based on the measured terminal voltage of each of cells B1–B8, to the system control unit SYC. Next, it is determined whether or not the module number k reaches the number n of the modules, and if k is less than n, the process returns to the step following the first step of setting the number n of the modules. Successively, the terminal voltage vm2 of the module Md2 is read in. The above-mentioned steps are repeated, and if the terminal voltage values of all of the n modules are read in, the subroutine SUB1 ends, and the process returns to the main routine shown in FIG. 3.

Figure 5:
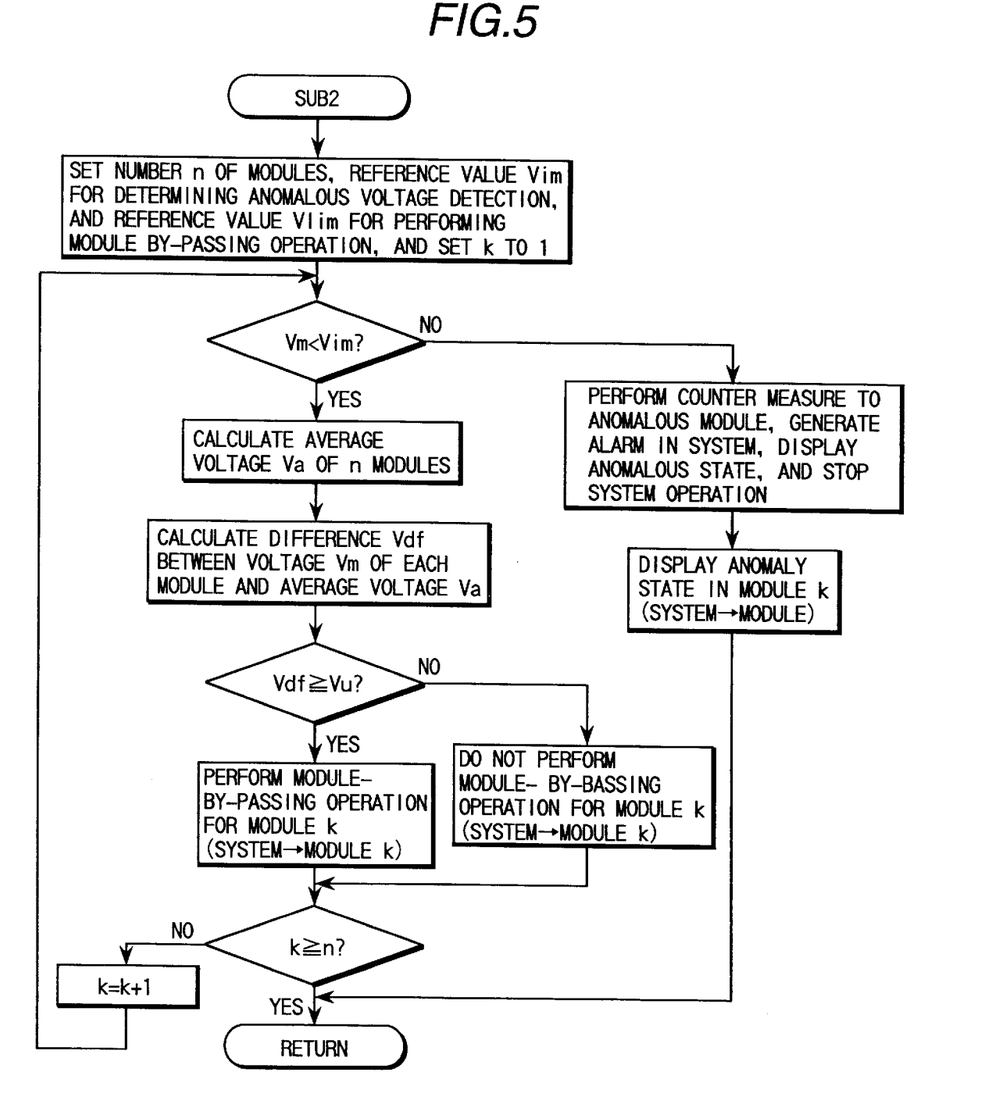
FIG. 5 is a flow chart of a subroutine SUB2 executed in the software shown in FIG. 3.

FIG. 5 is a flow chart of the subroutine SUB2. The subroutine SUB2 executes the processing of a countermeasure to an abnormal terminal voltage, comparing the terminal voltage values among the modules, and turning on or off each module by-pass circuit. First, the number n of the modules, the reference value Vim for determining an abnormal terminal voltage, and the reference value Vu for turning on each module by-pass circuit are set in the microcomputer SMC of the system control unit SYC, and the module number k is further set to the number 1. Next, the terminal voltage Vm1 of the module Md1 is compared with the reference value Vim for determining an abnormal terminal voltage, and if the terminal voltage Vm1 of the module Md1 is higher than the reference value Vim for determining an abnormal terminal voltage, an alarm is generated, an abnormal condition is displayed on the display unit SIP, and a countermeasure to the abnormality, such as stopping the operation of the system, is performed. Moreover, the abnormal condition is also displayed on the display device IP of the module Md1. If the terminal voltage Vm1 of the module Md1 is not higher than the reference value Vim for determining an abnormal terminal voltage, the average value Va of the terminal voltage values of the n modules is obtained, and the difference between the terminal voltage Vm1 of the module Md1 and the average value Va is also obtained. Furthermore, it is determined whether or not this difference exceeds the reference value Vu for turning on each module by-pass circuit, and if it exceeds the reference value Vu for turning on each module by-pass circuit, the module by-pass circuit for the module Md1 is turned on. Otherwise, the module by-pass circuit for the module 1 is turned off.

Afterward, it is determined whether or not the module number k has reached the number n of the modules, and if the module number k is less than n, the step of k=k+1 is executed, and the process returns to the step following the first step of setting the number n of the modules. The above-mentioned steps are then successively repeated for the terminal voltage Vm2 of the module Md2. Furthermore, the above steps are also repeated for each of the remaining modules, and if the processing of all the n modules in subroutine SUB2 is finished, the subroutine SUB2 ends, and the process returns to the main routine shown in FIG. 3. In this embodiment, although the module by-pass circuit for the module is turned on when the difference between the terminal voltage Vm of each module and the average voltage value Va exceeds the reference value Vu for turning on each module by-pass circuit, it is also possible to turn on a module by-pass circuit of each module when the difference between the terminal voltage Vm of each module and the lowest terminal voltage among the terminal voltage values of all the modules exceeds a reference value. As mentioned above, it is a main feature of the present invention that each module includes a module-controlling circuit for controlling cells in the module, which is controlled by at least one microcomputer and receives power from the module itself; and the control function for each module is performed by a system-controlling circuit connected to each module-controlling circuit via an electrical isolation device, based on information bilaterally transmitted between the system-controlling circuit and each module-controlling circuit.

As mentioned above, in accordance with the present invention, because information is transmitted between each module control unit and the system control unit via the isolation device, the charging variation among the modules is suppressed by controlling the module by-pass circuit provided in each module via each module control unit. More specifically, by connecting each module control unit and the system control unit with the bilateral transmission means and by exchanging information between each module control unit and the system control unit, the charging variation among the modules is thereby suppressed. Thus, the present invention is specially effective for: (1) achieving the full capacity of a battery system, because the charging variation among modules can be reduced; (2) improving the lifetime and the reliability of each module, because the charging variation among modules can be reduced; (3) improving the economic efficiency, because the deterioration over the lifetime of each module can be alleviated; and (4) achieving a simple control of a battery system, because the cell control in each module can be separated from the control of the total battery system. Finally, the present invention is also applicable to other systems that include batteries, such as a power storage system, in addition to a system for an electric vehicle.

What is claimed is:

1. A battery system, including a battery assembly that includes a plurality of modules, each of which includes a plurality of battery cells serially connected to each other for driving electrical loads by performing charging and discharging operations, and which is controlled by a system-controlling unit;

wherein each module includes measuring means for measuring voltage of each module, a module-controlling unit for transmitting a value of said measured voltage of said module to said system-controlling unit and for receiving a reference voltage value which is set in said system-controlling unit, and a module by-pass device connected to each module in parallel, which is situated for by-passing a part of the charging current for said module, and module-by-passing device-drive means for driving said module by-pass device based on a result of comparison between said measured voltage of said module and said reference voltage value; and wherein each battery cell includes a battery cell by-passing device connected to each battery cell in each module in parallel, which is situated for by-passing a part of the charging current for said battery cell, and battery cell by-passing device-drive means for turning on said battery cell by-passing device based on a variation in voltage values among battery cells in said module.

2. A battery system according to claim 1, wherein said module-controlling unit in each module includes at least one microcomputer and receives power from said serially connected battery cells in said module, and wherein bilateral transmission between said microcomputer and said system-controlling unit is performed via an electrical isolation device.

3. A battery system according to claim 1, wherein the battery cell by-passing devices which are provided in each module, and controlled by a control signal sent from said system-controlling unit are used for suppressing charging variation among said plurality of battery cells in said module, and are also used for suppressing charging variation among said plurality of modules.

4. An electric vehicle using a battery system according to claim 1, wherein each of said module-controlling circuits controls said battery cells in their corresponding module, with each said module-controlling circuit including at least one microcomputer and receiving power from said corresponding module; and wherein bilateral transmission between each module-controlling circuit and said system-controlling circuit is performed via an electrical isolation device.

5. A battery system, including a battery assembly that includes a plurality of modules, each of which includes a plurality of battery cells serially connected to each other, and which is controlled by a system-controlling unit;

wherein each module includes a measuring unit which measures voltage of each module, a module-controlling unit which transmits a value of said measured voltage of said module to said system-controlling unit and which receives a reference voltage value which is set in said system-controlling unit, and a module by-pass device connected to each module in parallel, which by-passes at least a part of the charging current for said module, and module by-passing device-drive means which drive said module by-pass device based on a result of comparison between said measured voltage of said module and said reference voltage value; and wherein each battery cell includes a cell by-passing device connected to each battery cell in each module in parallel, which by-passes a part of the charging current for said battery cell, and a battery cell by-passing device-drive device which turns on said battery cell by-passing device based on a variation in voltage values among battery cells in said module.

* * * * *